United States Patent [19]
Miller

[11] Patent Number: 6,105,157
[45] Date of Patent: Aug. 15, 2000

[54] SALPHASIC TIMING CALIBRATION SYSTEM FOR AN INTEGRATED CIRCUIT TESTER

[75] Inventor: Charles A. Miller, Fremont, Calif.

[73] Assignee: Credence Systems Corporation, Fremont, Calif.

[21] Appl. No.: 09/016,717

[22] Filed: Jan. 30, 1998

[51] Int. Cl.[7] .................................................. G01R 31/28
[52] U.S. Cl. .................... 714/744; 714/700; 714/736; 714/741; 333/100; 375/356; 702/89; 368/113; 324/73
[58] Field of Search .................................. 714/700, 736, 714/738, 741, 744; 324/73.1; 702/89; 368/113

[56] References Cited

U.S. PATENT DOCUMENTS

| | | | |
|---|---|---|---|
| 4,497,056 | 1/1985 | Sugamori | 714/736 |
| 4,734,637 | 3/1988 | Chen et al. | 324/642 |
| 4,833,397 | 3/1989 | McMurray, Jr. | 324/73.1 |
| 4,928,278 | 5/1990 | Otsuji | 714/700 |
| 5,385,392 | 1/1995 | Cantiant et al. | 365/233 |
| 5,387,885 | 2/1995 | Chi | 333/100 |
| 5,532,983 | 7/1996 | Madrid et al. | 368/113 |
| 5,644,261 | 7/1997 | Frisch et al. | 327/277 |
| 5,696,951 | 12/1997 | Miller | 713/503 |
| 5,712,882 | 1/1998 | Miller | 375/356 |
| 5,712,883 | 1/1998 | Miller et al. | 375/371 |
| 5,734,685 | 3/1998 | Bedell et al. | 375/356 |
| 5,884,236 | 3/1999 | Ito | 702/89 |

OTHER PUBLICATIONS

A Suite of Novel Digital ATE Timing Calibration Methods, Thaler, et al., IEEE, Aug. 1992.

Salphasic Distribution of Clock Signals for Synchronous Systems, Chi, IEEE, May 1994.

Adaptive Enhancement of Timing Accuracy and Waveform Quality in High–Performance IC Testers, Charoen, et al., IEEE, Feb. 1992.

*Primary Examiner*—Albert De Cady
*Assistant Examiner*—Guy J. Lamarre
*Attorney, Agent, or Firm*—Smith-Hill and Bedell

[57] ABSTRACT

An integrated circuit tester produces an output TEST signal following a pulse of a reference CLOCK signal with a delay that is a sum of an inherent drive delay and an adjustable drive delay. The tester also samples an input RESPONSE signal following a pulse of the reference CLOCK signal with a delay that is a sum of an inherent compare delay and an adjustable compare delay. The inherent drive and compare signal path delays within an integrated circuit tester are measured by first connecting a salphasic plane to transmission lines that normally convey signals between the tester and terminals of an integrated circuit device under test. A standing wave signal appearing on that salphasic plane is phase locked to the CLOCK signal so that a zero crossing of the standing wave occurs at a fixed interval after each pulse of the CLOCK signal. Each transmission line concurrently conveys the standing wave to the tester to provide timing references for measuring the inherent drive and compare signal path delays within the tester. Transmission line signal paths are also measured. Delays are added to the drive and compare signal paths to compensate for the measured inherent drive, compare and transmission line delays.

18 Claims, 9 Drawing Sheets

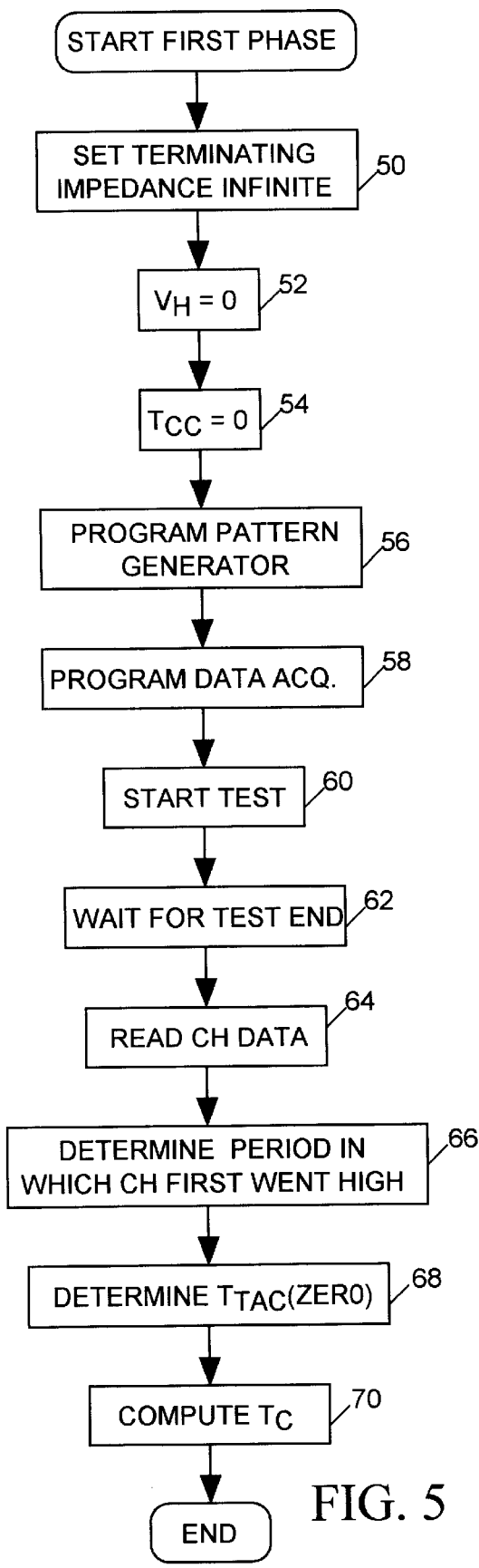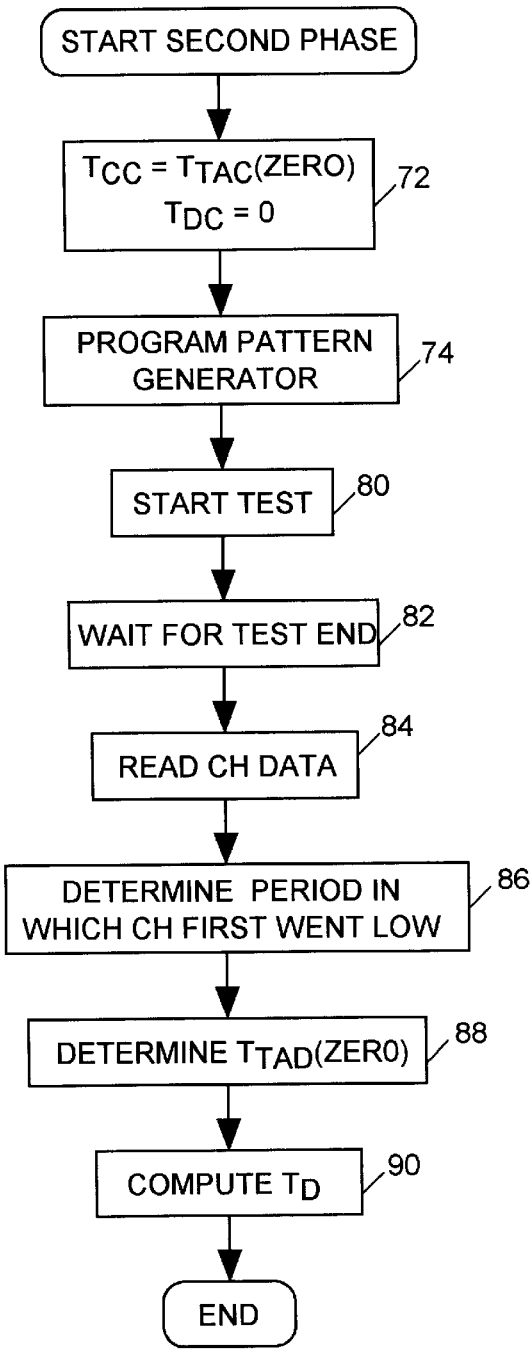
FIG. 5
FIG. 6

SALPHASIC TIMING CALIBRATION SYSTEM FOR AN INTEGRATED CIRCUIT TESTER

BACKGROUND OF THE INVENTION

1. Field of the Invention

The present invention relates in general to integrated circuit testers and in particular to a tester employing a salphasic plane when self-calibrating its signal timing.

2. Description of Related Art

A typical integrated circuit tester tests a digital logic integrated circuit device under test (DUT) by applying test signals of various logic states to DUT input terminals and by monitoring states of signals produced at DUT output terminals in response to the test signals to determine whether the DUT is behaving as expected. Such a tester typically includes a set of tester channels, each connected to a separate terminal of the DUT, and each carrying out all test activities with respect to that DUT terminal. A test is typically organized into a succession of test cycles. Each channel receives input ACTION and TIMING data for each test cycle telling the channel what actions to take during the test cycle and indicating the times during the test cycle at which it is to take those actions. Each channel may also receive EXPECT data indicating expected states of the DUT output signal (if any) during the test cycle. A channel may carry out any one or more of several actions during a test cycle. Such actions include driving a test signal applied to the DUT terminal to a high or low logic state, tristating the test signal, or sampling a DUT output signal to determine its logic state and comparing it to the EXPECT data.

Each channel includes a tristate driver for supplying a test signal to the DUT terminal and a compare circuit for producing output data indicating the state of the DUT output signal produced at the DUT terminal. A formatting and timing circuit within each channel responds to the input ACTION and TIMING data by producing three control signals, "TRISTATE", "DRIVE" and "COMPARE". The TRISTATE signal tristates the channel's driver and the DRIVE signal indicates whether the driver's output test signal is to be of a high or low logic level. The COMPARE signal tells the compare circuit when to sample the state of the DUT output signal. The ACTION data input to the formatting and timing circuit indicates which of the DRIVE, TRISTATE, and COMPARE signals are to change state during a next test cycle while the TIMING data indicates times during the test cycle at which those state changes are to occur.

In order to properly test a DUT it is necessary to closely synchronize the various test activities of all tester channels. For example suppose a DUT is expected to produce a high logic level output signal at a DUT terminal B 10 nanoseconds after it receives a high logic level test signal at a DUT terminal A at some time $T_x$ relative to the start of a test. To test the DUT for this expected behavior a first tester channel accessing DUT terminal A must assert its DRIVE signal so as to cause the channel's driver to send a high logic level signal to terminal A at time $T_x$. Later a second tester channel accessing DUT terminal B must assert its COMPARE signal to initiate sampling of the second channel's compare circuit so as to acquire data indicating the state of the DUT output signal at terminal B at time $T_x+10$ nsec.

Since we want the test signal to arrive at terminal A at time $T_x$, the timing and formatting circuit accessing terminal A must assert its output DRIVE signal some time before time $T_x$ in order to allow the driver time to respond to the DRIVE signal by changing the state of its output test signal and in order to allow the test signal sufficient time to travel to the DUT terminal. Thus while the ACTION and TIMING data input to the timing and formatting circuit may indicate the test signal is to be driven high at time $T_x$, the timing and formatting circuit should be "calibrated" to take the necessary action of asserting the DRIVE signal with an appropriate lead time before time $T_x$. That lead time should equal the total signal path delay between the DRIVE signal input to the driver and the DUT terminal.

Conversely, although the ACTION and TIMING data input to the second tester channel indicates that the channel is to sample the DUT output signal at time $T_x+10$ nanoseconds, the timing and formatting circuit of that channel must take its necessary action of asserting the COMPARE signal input to the compare circuit at some time other than $T_x+10$ nanoseconds in order to allow the DUT output signal sufficient time to travel to the compare circuit and to allow for the compare circuit time to respond to the COMPARE signal to sample it.

Thus in order to accurately time events at the DUT terminals, the timing and formatting circuit within each channel must advance state changes in their DRIVE and TRISTATE output signals and delay state changes in their COMPARE output signals from the times indicated by their input TIMING data to account for the above-described signal path delays. Since the drive and compare signal path delays can vary from channel-to-channel it is necessary to separately measure those signal path delays for each channel so that its timing and formatting circuit can be separately calibrated. Unfortunately measuring those signal path delays, typically through the use of oscilloscopes or other timing measurement devices, has heretofore been a difficult, tedious and timing consuming manual process.

What is needed is a system for quickly and easily calibrating the timing of an integrated circuit tester.

SUMMARY OF THE INVENTION

The present invention relates to a system for calibrating the timing of test activities carried out by an integrated circuit tester of the type which includes a set of tester channels connected through transmission lines to separate terminals of an integrated circuit device under test (DUT). Each channel includes a tristate driver for supplying a TEST signal to one of the DUT terminals and a compare circuit for sampling a DUT RESPONSE signal produced at the DUT terminal to determine its logic state. Each tester channel can produce an output TEST signal following a pulse of a reference CLOCK signal with a delay that is a sum of an inherent "drive" signal path delay $T_D$ and an adjustable drive delay $T_{TAD}$. Each tester channel can also sample an input RESPONSE signal following a pulse of the reference CLOCK signal with a delay that is a sum of an inherent "compare" signal path delay $T_C$ and adjustable compare delay $T_{TAC}$.

In accordance with one aspect of the invention, the inherent compare signal path delay $T_C$ is measured by first connecting the transmission lines that normally convey signals between the tester and terminals of the DUT to a salphasic plane instead of the DUT terminals. Thus the transmission lines instead convey signals between the tester and points within a homophasic region of the salphasic plane. A standing wave signal appearing in that homophasic region is phase locked to the CLOCK signal so that a zero crossing of the standing wave occurs at a fixed reference interval $T_{REF}$ after each pulse of the CLOCK signal. Transmission line terminating impedance is open circuited so that the transmission lines become a part of the salphasic plane and thus convey the standing wave to the output of the driver and to the input of the compare circuit of each tester channel. Under such conditions the transmission line signal path delay $T_L$ is 0 with regard to the standing wave. The adjustable compare delay $T_{TAC}$ is then adjusted until it takes on a value $T_{TAC}(ZERO)$ for which the comparator samples the standing wave signal at a time $(T_{REF}+T_C)$ when it crosses 0. $T_C$ is then computed as the difference between $T_{REF}$ and $T_{TAC}(ZERO)$.

In accordance with another aspect of the invention, the inherent drive signal path delay $T_D$ is measured with the salphasic plane still in place. The adjustable compare delay $T_{TAC}$ is set so that the compare circuit samples its input at a time after each CLOCK signal pulse that the standing wave is expected to cross zero. The driver is operated so that it produces two TEST signal pulses of opposite polarity after each CLOCK pulse that are separated in time by $T_{PN}$ and which have a pulse width of $T_{PW}$ where $T_{PN}$ and $T_{PW}$ are small compared to the period $T_{SAL}$ of the CLOCK and standing wave signals. If negative-going and positive-going pulses of the TEST signal are not centered about the zero crossing of the standing wave signal, they distort the zero crossing time of the resulting waveform sampled by the comparator. The timing of the TEST signal pulse edges relative to the CLOCK signal are iteratively adjusted until the standing wave signal zero crossing time is not distorted. The inherent drive delay $T_D$ is then computed as $$T_D = T_{REF} - T_{TAD}(ZERO) - (T_{PN}+T_{PW})/2$$

where $T_{TAD}(ZERO)$ is total adjustable delay of the leading edge of the first TEST signal pulse.

In accordance with a further aspect of the invention, the signal path delay $T_L$ of each transmission line is measured by first removing the salphasic plane so that when the driver produces an output TEST signal pulse, the pulse travels to the far end of the transmission line and then returns back over the transmission line to the input of the compare circuit. Thus the delay between the time the TEST signal pulse leaves the driver and the time it returns to the comparator input is twice the transmission line path signal delay $T_L$. With the inherent drive and compare delays known, the adjustable drive delay $T_{TAD}$ is set to 0 so that the driver produces an output TEST signal pulse with only its known inherent delay $T_D$ following each pulse of the CLOCK signal. The adjustable compare delay $T_{TAC}$ is then adjusted to determine a value $T_{TAC}(L)$ for which the compare circuit samples the leading edge of the TEST signal pulse. The transmission line path delay $T_L$ is then computed as $$T_L = (T_{TAC}(L)+T_C-T_D)/2$$

In accordance with a still further aspect of the invention, a compensating drive delay $T_{DC}$ is added to the drive signal path between the CLOCK signal and the driver and a compensating compare delay $T_{DC}$ is added to the compare signal path between the CLOCK signal and the compare circuit in accordance with the following:

$$T_{DC} = T_{OFFSET} - T_D - T_L$$

and $$T_{CC} = T_{OFFSET} - T_C + T_L.$$

The $T_{OFFSET}$ variable can be any value larger than $T_D+T_L$ SO as to avoid requiring $T_{DC}$ to be negative. Thereafter during tests of a DUT, the timing of TEST signal produced by all tester channels and the timing of RESPONSE signal sampling by all tester channels will be referenced to the same absolute time $T_{OFFSET}$ following the edge of CLOCK pulse.

The invention allows a host computer controlling the operation of the tester to automatically calibrate its timing. The calibration process is quick and accurate and requires little or no human intervention. The only calibration equipment needed is a simple salphasic clock plane that can take the place of a DUT to be tested.

It is accordingly an object of the invention to provide a method and apparatus for quickly and easily calibrating the timing of an integrated circuit tester.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates an integrated circuit tester for testing an integrated circuit device under test (DUT) that may be calibrated in accordance with the present invention, FIG. 2 illustrates the tester of FIG. 1 with its DUT load board removed and replaced with a timing calibration board in accordance with the present invention, FIG. 3 is a simplified block diagram showing signal path delays within with one tester channel and the transmission lines of FIG. 2, FIG. 4 illustrates timing relationships between the SW signal and the CLOCK signal of FIG. 3 during a first phase of a calibration procedure in accordance with the present invention;

FIG. 5 is a flow chart illustrating operations carried out by the host computer of FIG. 2 during the first phase of the calibration procedure, FIG. 6 illustrates a routine executed by the host computer of FIG. 2 during a second phase of the calibration procedure, FIGS. 7–9 illustrate timing relationships between the CLOCK, TEST and SW signals of FIG. 3 during various parts of the second phase of the calibration procedure, FIG. 10 is a timing diagram illustrating timing relationships between the TEST and CLOCK signals during a third phase of the calibration procedure, FIG. 11 illustrates a procedure the host computer of FIG. 2 carries out during the third phase of the calibration procedure;

DESCRIPTION OF THE PREFERRED EMBODIMENT(S)

Integrated Circuit Tester Architecture

Figure 1:
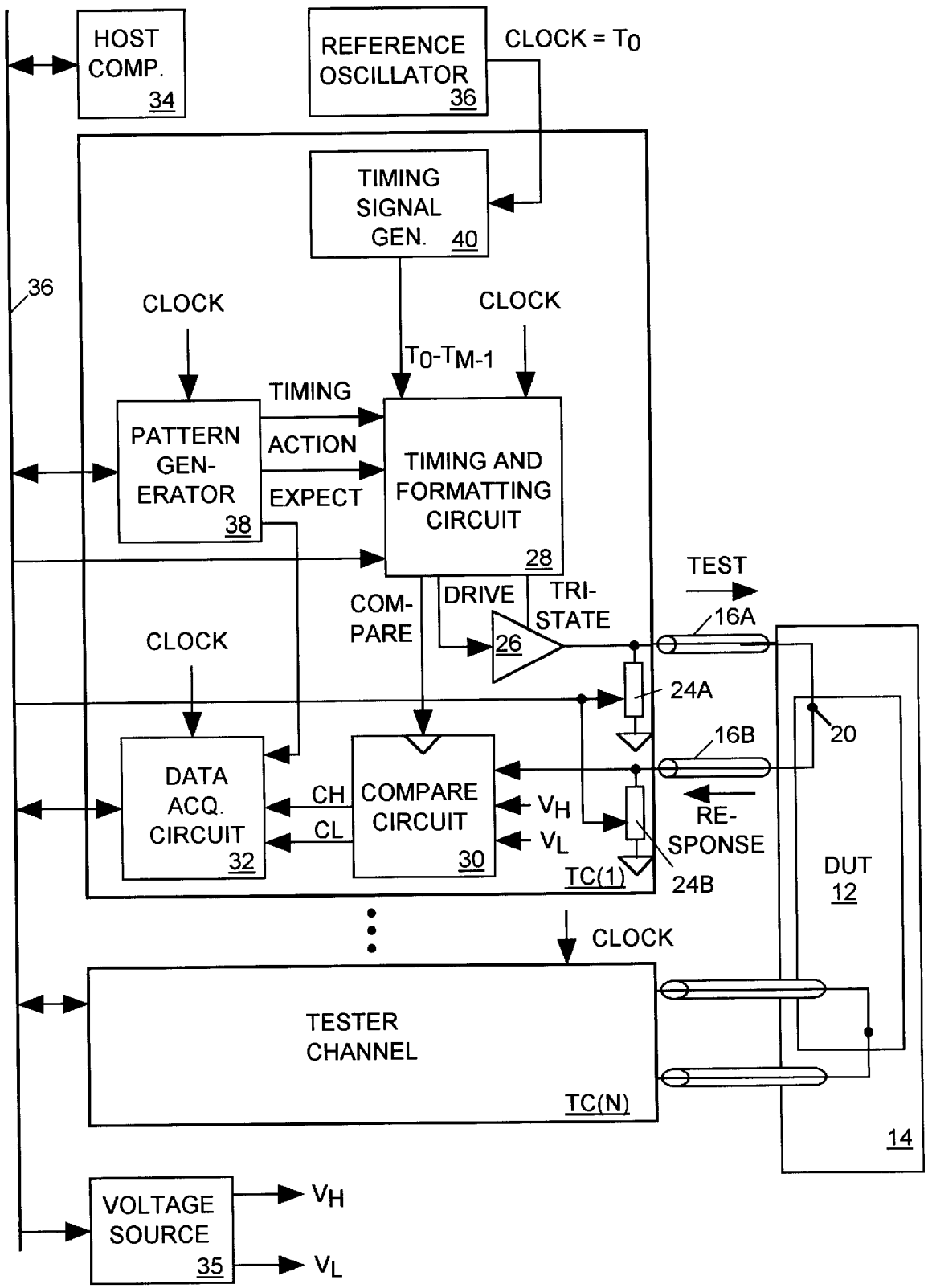

FIG. 1 illustrates an integrated circuit tester 10 for performing a digital logic test on an integrated circuit device under test (DUT) 12 mounted on a printed circuit load board 14. Tester 10 includes a set of N tester channels TC(1)–TC(N). Each channel TC(1)–TC(N) is connected to a separate terminal of DUT 12 through a pair of transmission lines 16A and 16B, each including a remote end for contacting a DUT terminal 20 so that each transmission line may convey signals between the DUT terminal and the tester channel. Transmission lines 16A and 16B have similar characteristic impedances normally matched by a programmable terminating impedance 24A or 24B to prevent signal reflections. Host computer 34 may adjust the impedance of impedance system 24 of each channel TC(1)–TC(N) by sending control data to impedances 24A and 24B via bus 36.

Each DUT terminal 20 may be either an input terminal, and output terminal or both an input and an output terminal. Each channel TC(1)–TC(N) includes a tristate driver 26 for supplying a tristate test signal (TEST) to the DUT via transmission line 16A of a logic state determined by DRIVE and TRISTATE signals produced by a timing and formatting circuit 28. Transmission line 16B delivers a RESPONSE signal produced DUT 12 at DUT terminal 20 to a compare circuit 30 in each channel TC(1)–TC(N). In response to a pulse of a COMPARE signal also produced by timing and formatting circuit 28, a conventional compare circuit 30 samples the state of the RESPONSE signal and produces output data bits CH and CL. The CH data bit indicates whether the sampled voltage level of the RESPONSE signal exceeded a high logic level reference voltage $V_H$ and the CL data bit indicates whether the RESPONSE signal level was lower than a low logic level reference voltage $V_L$. An adjustable voltage source 35 controlled by data from host 34 via bus 36 supplies reference voltages $V_L$ and $V_H$ to compare circuits 30 within all channels. The CH and CL bits are supplied to a conventional data acquisition circuit 32.

A test is organized into a succession of test cycles of uniform length. An oscillator 36 supplies a periodic CLOCK signal to conventional pattern generator 38. The leading edge of each CLOCK pulse marks the start of a cycle of the test. Host computer 34 initiates a test by sending a START signal concurrently to the pattern generator 38 and data acquisition circuit 32 of all tester channels via a control line of bus 36. Pattern generator 38 responds to each CLOCK signal pulse thereafter by supplying TIMING and ACTION data to timing and formatting circuit 28 and by supplying EXPECT data to data acquisition circuit 32. The EXPECT data indicates the expected states of the CH and CL data provided by compare circuit 30 during the next test cycle. Data acquisition circuit 32 responds to each CLOCK signal pulse after the START signal by acquiring the last CH and CL data produced by compare circuit 30 during a preceding test cycle. Host computer 34 can program data acquisition circuit 30 to either store the CH or CL bits for later access by the host computer 34, or to determine whether they match their expected states as indicated by the EXPECT data and signal host computer 34 via bus 36 when they don't.

Reference oscillator 36 also supplies the CLOCK signal to a timing signal generator 40. Timing signal generator 40 produces a set of M timing signals $T_0$–$T_{M-1}$. The timing signals $T_0$–$T_{M-1}$ have the same frequency as the CLOCK signal but they are evenly distributed in phase so they divide the period of the CLOCK signal into M equal intervals. Timing and formatting circuit 28 uses the timing signals $T_0$–$T_{M-1}$ as timing references when initiating test activities.

During each test cycle, timing and formatting circuit 28 controls its output DRIVE, TRISTATE and COMPARE signals in response to the input ACTION and TIMING data provided by pattern generator 38 before the start of the test cycle. The ACTION data indicates one or more test actions that are to be carried out during the test cycle and the TIMING data indicates times at which those actions are to occur relative to the CLOCK signal ($T_0$) that marked the start of the test cycle. The ACTION data may, for example, indicate that the TEST signal is to change state during the test cycle at a particular time indicted by the TIMING data. In such case timing and formatting circuit 28, when properly calibrated, responds to the ACTION and TIMING data by selecting an appropriate timing signal $T_0$–$T_{N-1}$ as a timing reference and then responding to a change in state of the timing signal by changing the state of its output DRIVE and/or TRISTATE signal so as to cause the indicated state change in the TEST signal supplied to DUT 12 at the time indicated by the TIMING data. Since the TIMING data indicates a time at which the TEST signal should change state at the DUT terminal 20 relative to the CLOCK signal pulse, timing circuit 28 must actually change the state of the DRIVE or TRISTATE signal in advance of that time to account for it own inherent delay in responding to a state change in the selected timing signal $T_0$–$T_{M-1}$, to account for the inherent delay in the response of driver 26 to changes in state of the DRIVE or TRISTATE signals, and to account for the time the TEST signal requires to travel over transmission line 16A to DUT terminal 20. The sum of the inherent delays of timing and formatting circuit 28 and the inherent delay of driver 26 is herein defined as the "inherent drive delay" $T_D$.

When the ACTION data indicates compare circuit 30 is to determine the state of the DUT's RESPONSE signal output at a time relative to the CLOCK pulse indicated by the TIMING data, format and timing circuit 28 generates a COMPARE signal pulse in response to a pulse of a selected one of the timing signals $T_0$–$T_{M-1}$. When properly calibrated, formatting and timing circuit 28 chooses its timing signal to offset the output COMPARE signal pulse from the time indicated by the TIMING data to account for its inherent delay in responding to a change in state of the selected timing signal, to account for the inherent delay compare circuit 30 in responding to the COMPARE signal pulse and to account for the time the RESPONSE signal needs to travel over transmission line 16B to compare circuit 30. This ensures that the output bits CH and CL of compare circuit 30 reflect the state of the RESPONSE signal as it appeared at the DUT terminal 20 at the time indicated by the TIMING data. The sum of the inherent delays of timing and formatting circuit 28 and compare circuit 30 is herein defined as the channel's "inherent compare delay" $T_C$.

The present invention relates to a system for measuring the inherent drive and compare delays of each channel TC(1)–TC(N), for measuring the signal path delays of transmission lines 16A and 16B, and for calibrating the timing and formatting circuit 28 of each tester channel TC(1)–TC(N) so that it offsets its output DRIVE, TRISTATE and COMPARE signals by appropriate amounts to ensure that test events occur at the times relative to the CLOCK signal pulses indicated by the TIMING data.

Calibration Board

Figure 2:
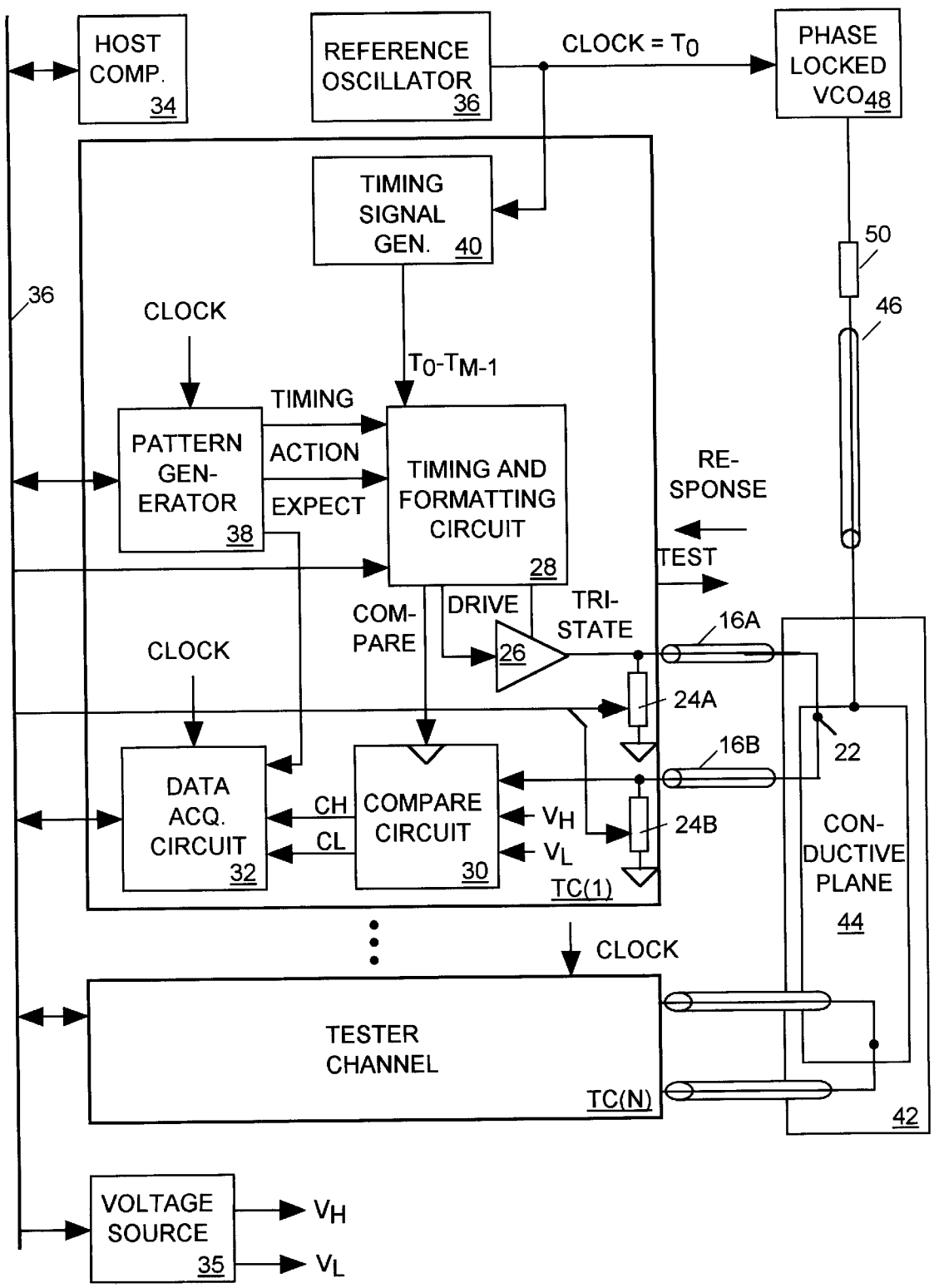

The calibration procedure employs a novel "timing calibration board" that is installed in tester 10 in place of load board 14 of FIG. 1. FIG. 2 illustrates tester 10 of FIG. 1 with load board 14 removed and replaced with such a timing calibration board 42 in accordance with the present invention. The physical structure of load boards can vary depending on the nature of the DUT being tested and on the nature of the interface the tester uses to hold and access the DUT. Calibration board 42 must generally match the physical structure of load board 14 of FIG. 1 to the extent needed to allow it to be installed in tester 10 in place of load board 14. Calibration board 42 replaces the DUT 12 of FIG. 1 with a conductive plane 44 arranged such that transmission lines 16A and 16B from each channel TC(1)–TC(N) access points 22 on conductive plane 44 in the same way they access DUT terminals 20 when load board 14 is installed in the tester. The CLOCK signal output of reference oscillator 36 is supplied at a reference signal input to a conventional phase locked, voltage controlled oscillator (VCO) 48. VCO 48 produces an output sine wave signal SW that is phase locked to the CLOCK signal. The SW signal passes through an impedance 50 to conductive plane 44. The shape and structure of conductive plane 44 and the value of impedance 50 are adjusted so that the SW signal appears as a standing wave on conductive plane 44, thereby causing conductive plane 44 to act as a "salphasic plane". VCO 48 and impedance 50 can be either a part of the tester 10 or mounded on calibration board 42. Salphasic planes are well-known in the art and are described in U.S. Pat. No. 5,387,885 issued to Vernon L. Chi on Feb. 7, 1997, incorporated herein by reference.

Conductive plane 44 is designed so that all points of contact 22 of transmission lines 16A and 16B from all channels TC(1)–TC(N) lie within a common homophasic region of plane 44. Although a standing wave on a salphasic plane may vary in amplitude from point-to-point within a homophasic region of a salphasic plane, the standing wave has the same phase at every point within a homophasic region. In particular a standing sine wave crosses 0 volts at the same time at every point in the homophasic region. Thus since the standing wave SW crosses 0 at every point 22 on plane 44 at the same time with a known, fixed reference delay of $T_{REF}$ following each CLOCK signal pulse.

When calibration board 42 is installed in tester 10, host computer 34 sets terminating impedances 24A and 24B of each channel TC(1)–TC(N) DUT for infinite impedance so that the SW signal is reflected as it reaches driver 26 and compare circuit 30. This makes transmission lines 16A and 16B of each channel a part of the homophasic region of plane 44. Thus the compare circuits 30 of all channels TC(1)–TC(N) see the standing wave signal SW cross 0 volts at their input terminals at the same time.

Time Delay Definitions

Figure 3:
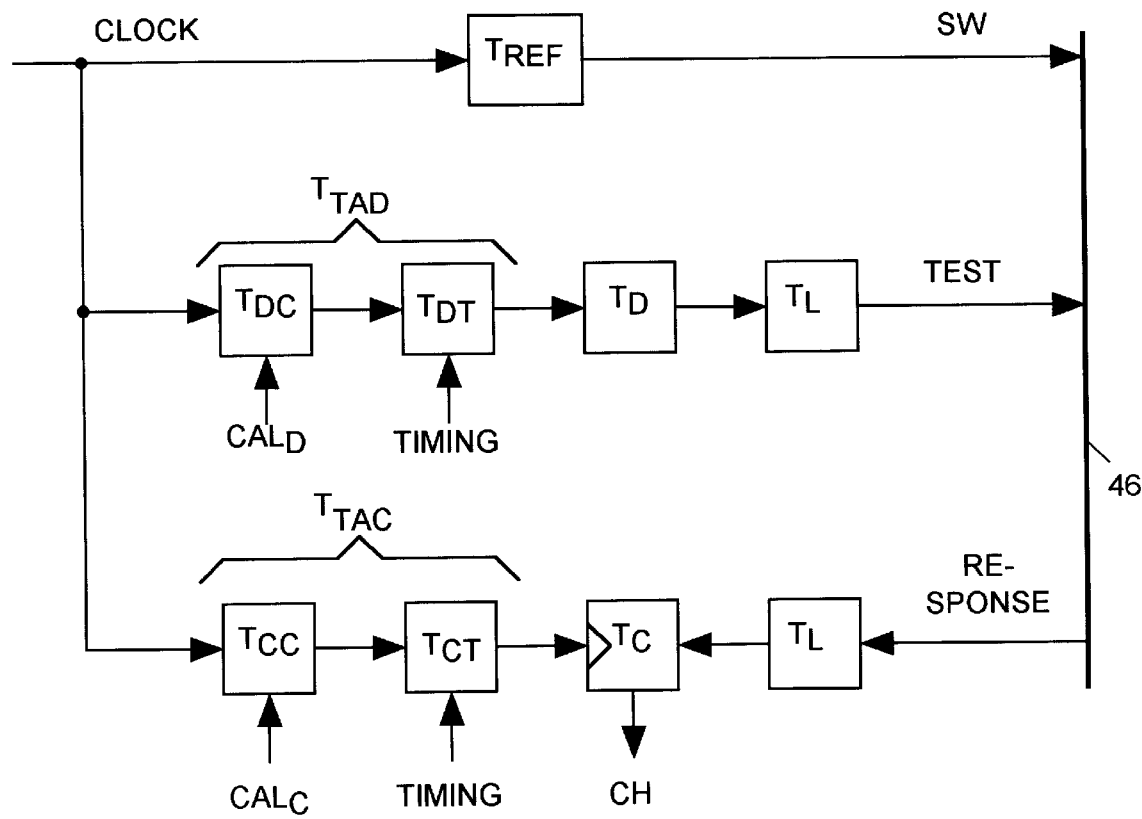

FIG. 3 is a simplified block diagram showing signal path delays associated with relevant components of tester channel TC(1) and calibration board 44 and transmission line 16A and 16B of FIG. 2. The delays illustrated in FIG. 3 are defined as follows:

$T_{DT}$ is an adjustable "drive timing" component of the total delay the timing and formatting circuit 28 provides between the CLOCK signal pulse and a change in state of its output DRIVE or TRISTATE. $T_{DT}$ is controlled by the TIMING data input to timing and formatting circuit 28.

$T_{DC}$ is an adjustable "drive calibration" component of the total delay provided by timing and formatting circuit 28 between the CLOCK signal pulse and a change in state of its output DRIVE signal. $T_{DC}$ is controlled by input drive calibration data $CAL_D$ from host computer 34 via bus 36.

$T_D$ is the inherent drive delay, the sum of the inherent delays of timing and formatting circuit 28 and driver 26. $T_D$ is the delay between an edge of the CLOCK signal and the time driver 26 produces an output TEST signal when adjustable delays $T_{DC}$ and $T_{DT}$ are 0.

$T_{CT}$ is an adjustable "compare timing" component of the delay timing and formatting circuit 28 provides between the CLOCK signal pulse and its output COMPARE signal. $T_{CT}$ is also controlled by the TIMING data input to timing and formatting circuit 28.

$T_{CC}$ is an adjustable "compare calibration" component of the delay provided by timing and formatting circuit 28 between the CLOCK signal pulse and its output COMPARE signal. This delay is controlled by input compare calibration data $CAL_C$ from host computer 34 via bus 36.

$T_C$ is the inherent compare delay, the sum of the inherent delays of timing and formatting circuit 28 and compare circuit 30. $T_C$ is the delay between an edge of the CLOCK signal and the time at which compare circuit 30 samples its input RESPONSE signal when adjustable delays $T_{CC}$ and $T_{CT}$ are zero.

$T_L$ is the signal path delay of each transmission line 16A and 16B between the driver 26 or comparator 30 and a terminal 20 of DUT 12. The transmission lines 16A and 16B for each particular channel are matched and have similar signal path delays, although transmission line signal path delay may vary from channel-to-channel.

$T_{REF}$ is the known, fixed delay between an edge of the CLOCK signal and the positive-going zero crossing of the sinusoidal standing wave SW appearing on the homophasic region 46 of plane 44. $T_{REF}$ is suitably adjusted so that it is approximately half the period $T_{SAL}$ of the CLOCK signal and larger than $T_D + T_L$.

$T_{TAD}$ is the "total adjustable drive" delay and is equal to the sum of $T_{DC}$ and $T_{DT}$.

$T_{TAC}$ is the "total adjustable compare" delay and is equal to the sum of $T_{CC}$ and $T_{CT}$.

Timing Calibration Procedure

The timing calibration procedure of the present invention includes four phases. In the first, second and third phases of the procedure the inherent compare and drive delays $T_C$ and $T_D$ and transmission line delay $T_L$ are measured. In the fourth phase of the procedure the drive and compare calibration data $CAL_D$ and $CAL_C$ are computed and written into timing and formatting circuit 28 to properly adjust the compare and drive calibration delays $T_{CC}$ and $T_{DC}$ as needed to compensate for the measured $T_C$, $T_D$, and $T_L$ delays.

Measuring Inherent Compare Delay $T_C$

Figure 4:
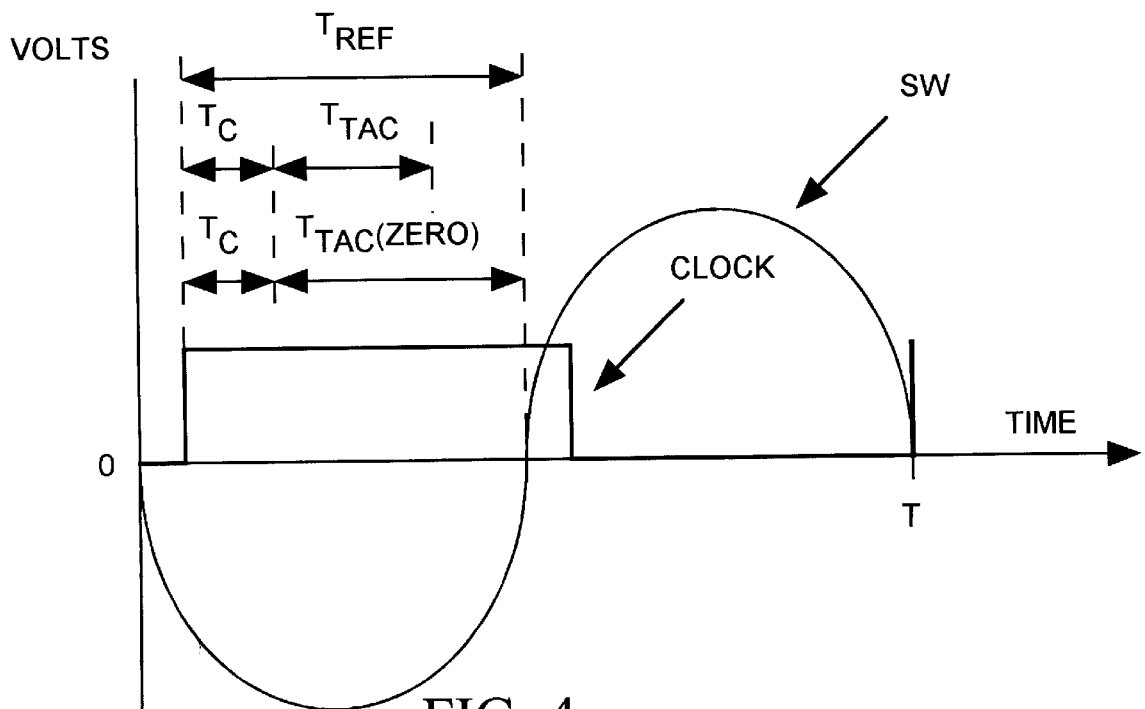

Host computer 34 determines the inherent compare delay $T_C$ during a first phase of the calibration procedure. FIG. 4 illustrates timing relationships during the first phase of the calibration procedure and shows the timing relationship between the SW signal and the CLOCK signal when $T_{REF}$ is selected to be a little less than one half the period $T_{SAL}$ of the clock signal. FIG. 5 is a flow chart illustrating operations carried out by host computer 34 during the first phase of the calibration procedure.

Before an operator signals host computer 34 to carry out the first phase of the calibration procedure, the operator installs calibration board 42 of FIG. 2 in tester 10. When signaled to start the first phase, host computer 34 programs terminating impedances 24A and 24B to make them provide infinite impedance so that transmission lines 16A and 16B become a part of the salphasic plane (step 50, FIG. 5). Since transmission lines 16A and 16B are a part of the salphasic plane, their transmission line delay $T_L$ is 0 with respect to the standing wave SW. Therefore compare circuits 30 of all channels TC(1)–TC(N) see standing wave signal SW rise above 0 volts with the same delay $T_{REF}$ following each leading edge of the CLOCK signal pulse.

Host computer 34 then sets the $V_H$ input to the compare circuit 30 of each channel TC(1)–TC(N) to 0 volts (step 52)

so that the CH output of each compare circuit 30 goes high to indicate a sampled standing wave signal SW is above 0 volts. From FIG. 4 it may be seen that with transmission line delay $T_L$ equal to 0, the zero crossing of the SW signal will appear at the input of compare circuit 30 with a fixed delay of $T_{REF}$ after the leading edge of the CLOCK pulse. Therefore if host computer 34 adjusts the total adjustable compare delay $T_{TAC}$ to a value $T_{TAC}(ZERO)=T_{REF}-T_C$ then compare circuit 30 will sample the SW signal at its zero crossing. Accordingly during this first phase of the calibration procedure, host computer 34 experimentally adjusts the total adjustable compare delay $T_{TAC}$ (by adjusting the $CAL_D$ and/or TIMING data supplied to timing and formatting circuit 28) to determine from the data collected by data acquisition circuit 32 that compare circuit 30 is sampling the SW signal as close as possible to its positive zero crossing. At that point host computer 34 can compute the value of inherent compare delay $T_C$ as $$T_C = T_{REF} - T_{TAC}(ZERO) \quad [1]$$

Those skilled in the art will appreciate that there are many ways to experimentally determine the value of $T_{TAC}(ZERO)$. In the preferred embodiment of the invention, as illustrated in FIG. 5, host computer 34 writes calibration data $CAL_C$ into timing and formatting circuit 28 which sets $T_{CC}$ to 0 (step 54). Host computer 34 then programs pattern generator 38 to produce a sequence of ACTION and TIMING data causing tester 10 to perform a "test" in which timing and formatting circuit 28 produces a COMPARE pulse with a progressively increasing delay $T_{CT}$ after each CLOCK pulse (step 56). Host computer 34 also programs data acquisition circuit 32 to store the CH output bits of compare circuit 30 (step 58). After host computer 34 signals pattern generator 38 to start the test (step 60) host computer waits (step 62) until pattern generator 38 of TC(1) sends an interrupt to host computer 34 indicating that the test is complete (step 62). At that point host computer 34 reads the CH data bits for each test cycle out of the acquisition memory within the data acquisition circuit 32 of each channel TC(1)–TC(N) (step 64) and determines the test period for which the CH bit first went true in each channel (step 66). Since $V_H$ was set to 0 volts, the CH bit will first go true during the first test cycle in which compare circuit 30 samples the SW signal after it has risen above 0 volts. Host computer 34 then determines from the manner in which it programmed pattern generator 38 the value of $T_{TAC}(ZERO)$ (step 68). Host computer 34 may then compute the inherent compare delay $T_C$ in accordance with equation [1] (step 70). The routine for the first phase of the calibration then ends.

If the time increments by which $T_{TAD}$ was increased for each cycle of the first phase test procedure are as small as timing and formatting circuit 28 is capable of, then the value of $T_C$ host computer 34 computes at step 70 will be accurate within the tester's timing resolution capability.

Measuring Inherent Drive Delay

Figure 7:
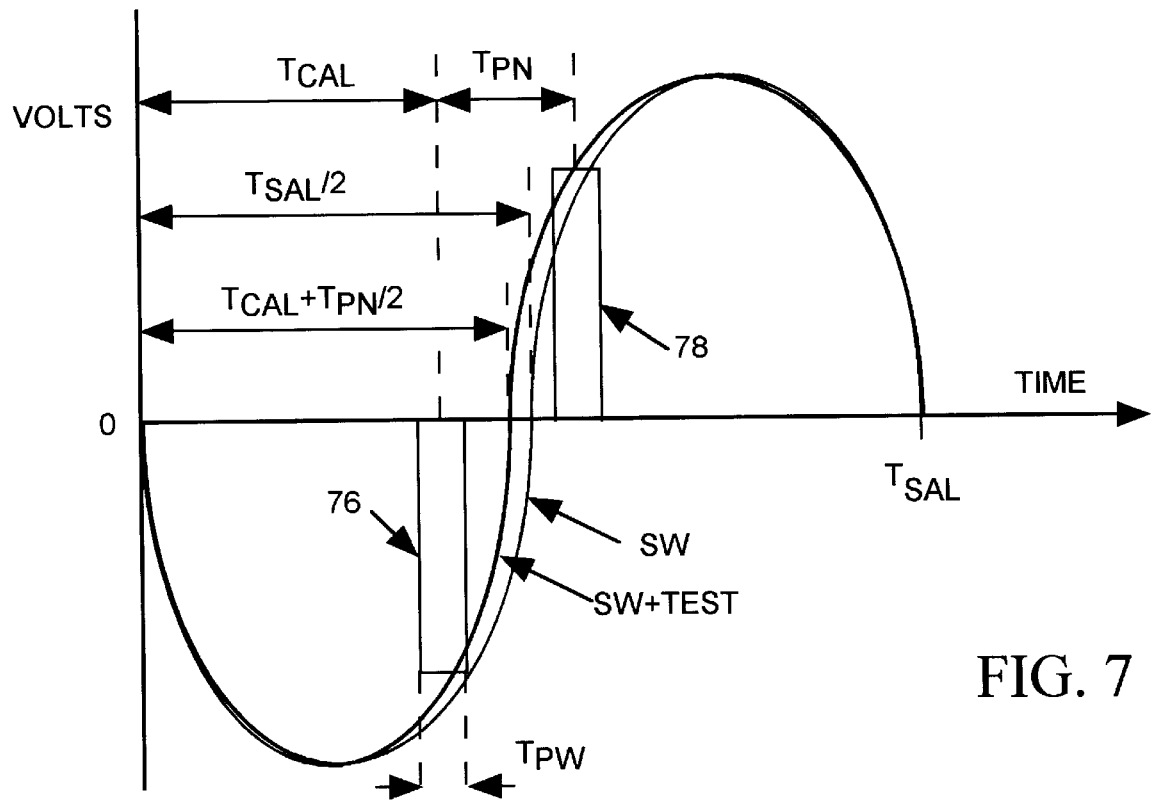
Figure 8:
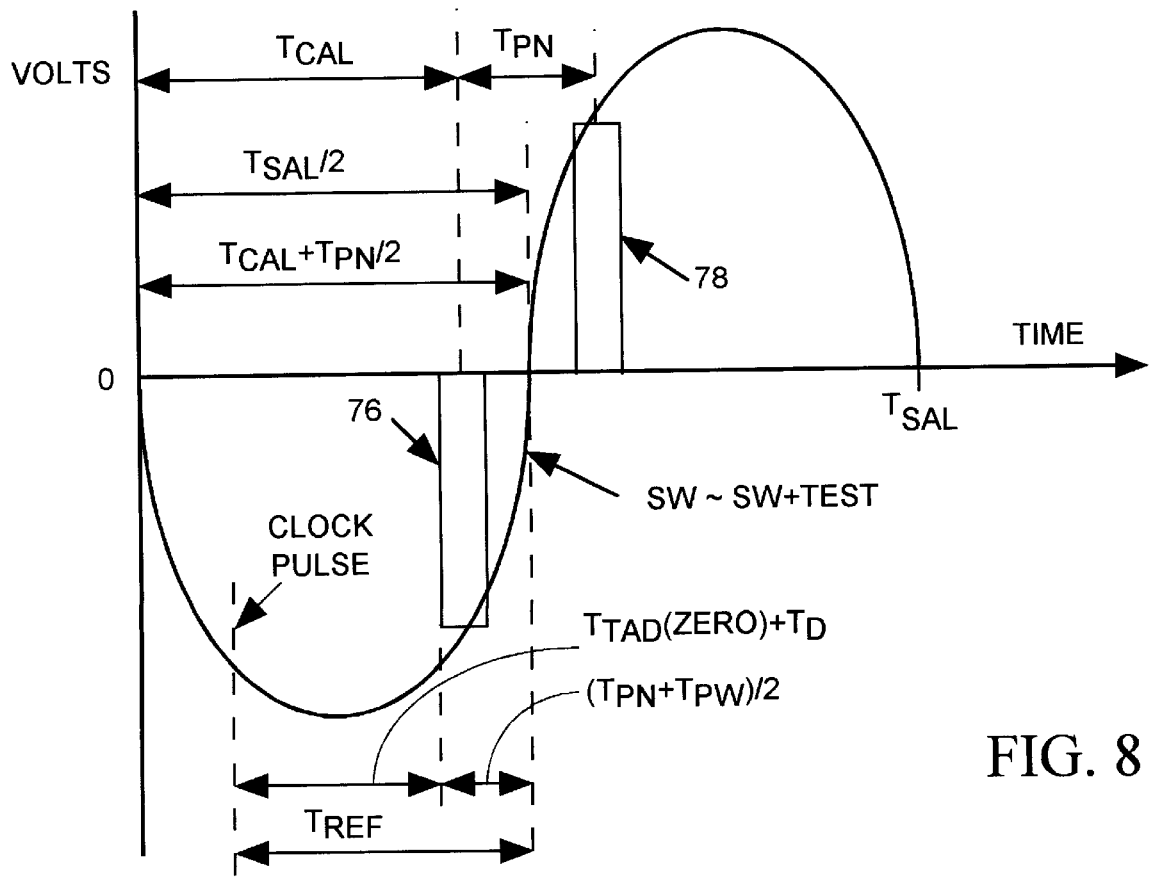
Figure 9:
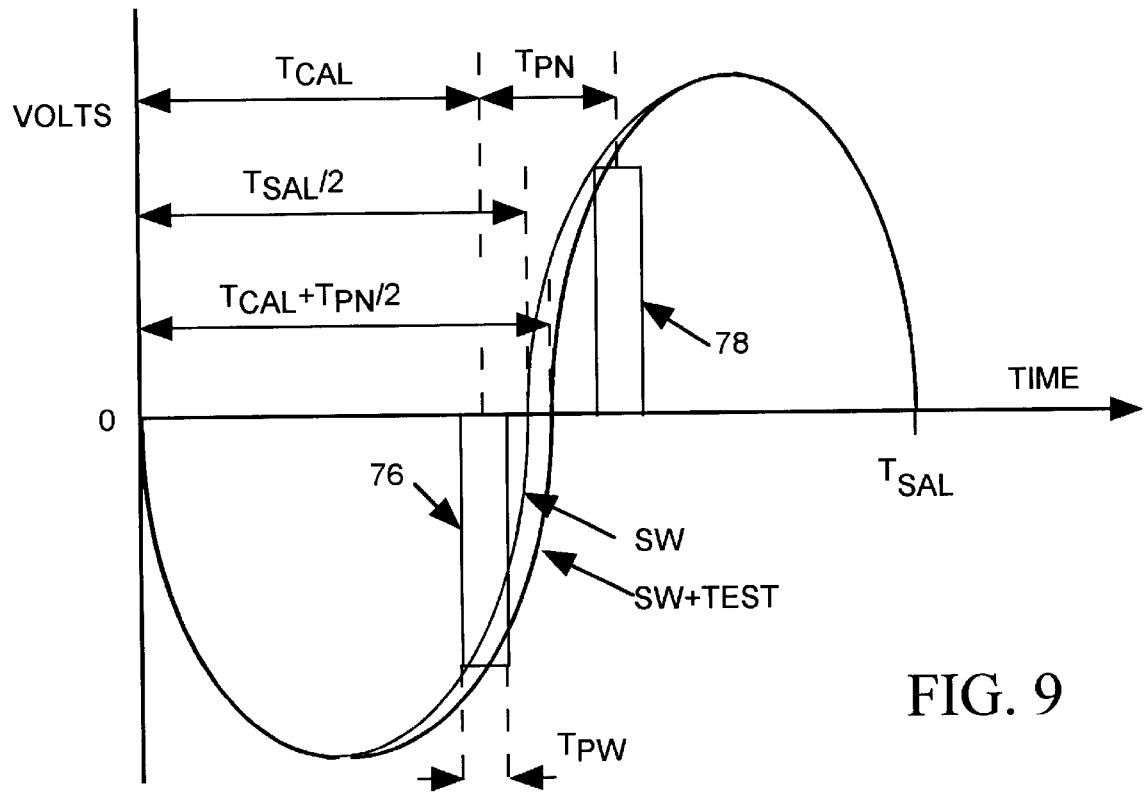

FIG. 6 illustrates a routine executed by host computer 34 during the second phase of the calibration procedure and FIGS. 7–9 illustrate timing relationships between the CLOCK, TEST and SW signals during the second phase.

Host computer 34 starts its second phase routine, as illustrated in FIG. 6, immediately after completing the first phase routine. The calibration board 42 of FIG. 2 remains installed in the tester and $V_H$ remains set at zero volts. During the second phase, host computer 34 successively determines the inherent drive delay $T_D$ for each channel TC(1)–TC(N) by repeating routine of FIG. 6 for each channel.

Host computer 34 first supplies calibration data $CAL_C$ and $CAL_D$ to timing and formatting circuit 28 of the particular channel TC(1)–TC(N) to be calibrated to set the compare calibration delay $T_{CC}$ to the value of $T_{TAC}(ZERO)$ determined during the first phase and to set the drive calibration delay $T_{DC}$ to 0 (step 72). It then programs pattern generator 38 of that channel to produce a new sequence of ACTION and TIMING data (step 74). That sequence of TIMING and ACTION data tells timing and formatting circuit 28 to produce a COMPARE pulse during each test cycle with a delay $T_{CT}=0$. Since $T_{CC}=T_{TAD}(ZERO)$ and $T_{CT}=0$, then compare circuit 30 should sample the standing wave SW at time SW is expected to cross above zero volts.

The TIMING and ACTION data to be produced by pattern generator 38 also tells timing and formatting circuit 28 to produce DRIVE and TRISTATE signals that make driver 26 generate two TEST signal pulses after each CLOCK signal pulse. As illustrated, for example in FIG. 7, a first pulse 76 of the TEST signal is negative-going and has a narrow pulse width $T_{PW}$ and has a midpoint occurring at time $T_{CAL}$. The second pulse 78 is positive going and has a midpoint appearing at time $T_{CAL}+T_{PN}$ where $T_{PN}$ is the time separation between the first and second pulses 76 and 78. The timing and pulse width of the first and second pulses 76 and 78 is controlled by adjusting $T_{TAD}$ for each pulse edge. During each successive cycles of this phase of the calibration procedure, the value of $T_{CAL}$ is progressively increased to that the TEST signal pulses 76 and 78 occur progressively later during each successive SW signal cycle.

FIG. 7 illustrates the timing relationship between the TEST signal pulses 76 and 78 and the SW signal during an early cycle of the this phase of the calibration procedure when $T_{CAL}$ is small. During this cycle, the TEST signal pulses 76 and 78 appear "too soon" and are not centered about the zero crossing of the SW signal. Thus the TEST signal pulses 76 and 78 distort the SW signal so that the resulting signal SW+TEST seen by compare circuit 30 crosses zero at a time $(T_{CAL}+T_{PN}/2)$ before the time $T_{SAL}/2$ at which the SW signal would have crossed zero had the SW signal not been distorted by the TEST signal pulses. Since compare circuit 30 samples the SW+TEST signal at time $T_{SAL}/2$, the CH output of compare circuit 30 indicates the SW signal is above 0.

As $T_{CAL}$ increases it reaches a value for which the TEST signal pulses 76 and 78 are centered about $T_{SAL}/2$ and do not significantly distort the SW signal, as illustrated in FIG. 8. At this point $T_{CAL}+T_{PN}$ is equal to $T_{SAL}/2$. Thus the SW+TEST signal crosses 0 at time $T_{SAL}/2$.

As $T_{CAL}$ continues to increase, pulses 76 and 78 begin to lag peaks of the SW signal, as illustrated in FIG. 9 and begin to again distort the SW signal. In this case the SW+TEST signal crosses 0 after compare circuit 30 samples it. Thus the CH output of compare circuit 30 indicates the SW signal is below 0.

Referring again to FIG. 6, after programming pattern generator 38, host computer 34 signals the pattern generator to begin the test (step 80) and waits until the pattern generator signals that the test is complete (step 82). Host computer 34 then reads the acquired CH data out of data acquisition circuit 32 (step 84) and determines the test period in which CH first went low (step 86). During this test cycle the TEST signal pulses 76 and 78 are substantially coincident with the SW signal peaks as illustrated in FIG. 8. Host computer 34 then determines from the TIMING data for that test cycle a value of $T_{TAD}(ZERO)$ (step 88) where $T_{TAD}(ZERO)$ is the value of $T_{TAD}$ that produced the leading edge of pulse 76. Host computer 34 can then compute the value of the channel's inherent drive delay $T_D$(step 90) in accordance with the following expression:

$$T_D = T_{REF} - T_{TAD}(ZERO) - (T_{PN} + T_{PW})/2 \qquad [2]$$

where $T_{PW}$ is the TEST signal pulse width and $T_{PN}$ is the spacing between pulses 76 and 78. Host computer 34 separately carries out the second phase of the calibration procedure for each channel TC(1)–TC(N) to determine its inherent drive delay.

Measuring Transmission Line Path Delay

Figure 10:
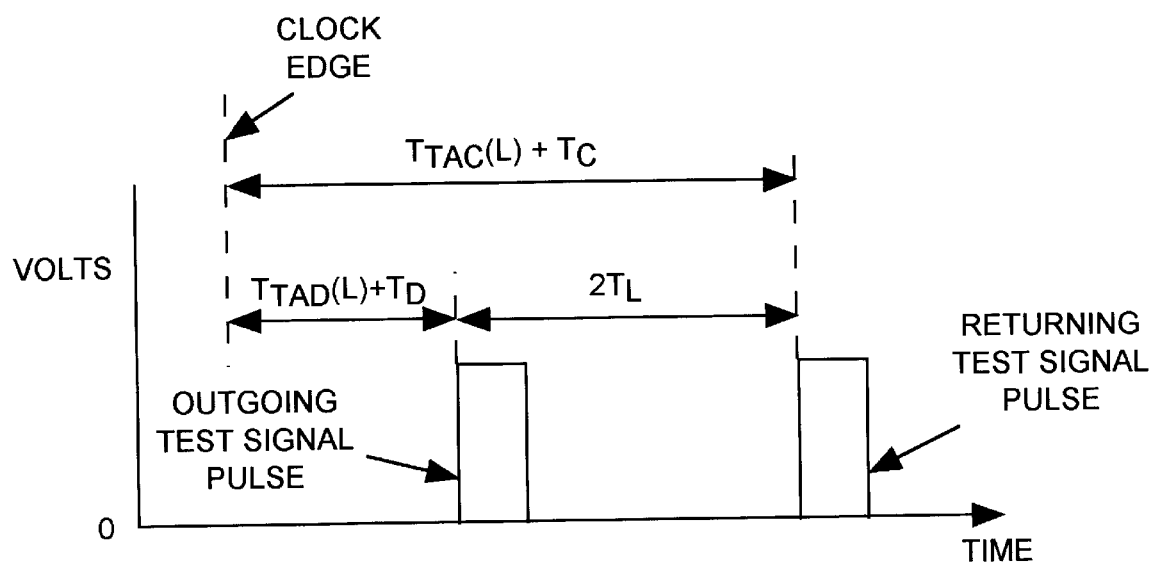
Figures 11, 12:
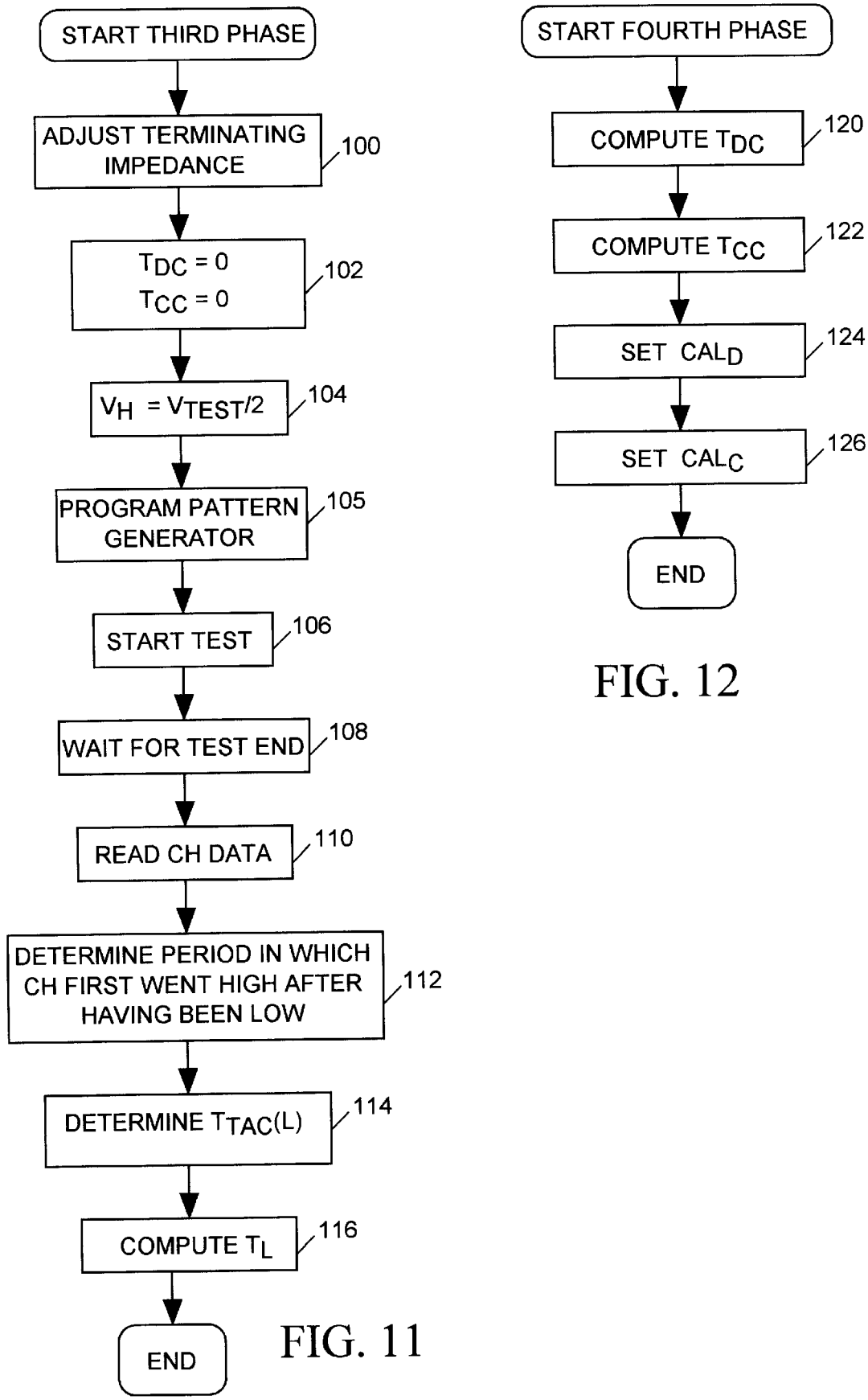
FIG. 12 illustrates a procedure the host computer of FIG. 2 carries out during a final phase of the calibration procedure.

FIG. 10 is a timing diagram illustrating the process of measuring the signal path delay $T_L$ of transmission lines 16A and 16B. FIG. 11 illustrates the procedure host computer 34 carries out to determine the signal path delay $T_L$ of each transmission line 16A and 16B of FIG. 1 during the third phase of the calibration procedure. Before signaling host computer 34 to execute that routine, the operator removes the calibration board 42 so that the remote ends of each transmission line 16A and 16B are connected only to one another. Beginning at step 100 (FIG. 11), host computer 34 sets terminating impedances 24A and 24B of FIG. 2 to the characteristic impedance of transmission line 16. Thus whenever driver 26 generates a TEST signal pulse, that pulse travels to the remote end of transmission line 16A and then travels back through transmission line 16B to compare circuit 30. The round trip travel time of the TEST signal pulse is equal to twice the transmission line signal path delay $T_L$.

Host computer 34 also writes $CAL_D$ and $CAL_C$ data into timing and formatting circuit 28 to set $T_{CD}=0$ and to set $T_{CC}=0$ (step 102). Host computer 34 then sets $V_H$ above 0, for example to $V_{TEST}/2$ (step 104), where $V_{TEST}$ is the voltage of the TEST signal pulse. Host computer 34 then (step 105) programs pattern generator 38 to produce an output TIMING and ACTION data sequence telling timing and formatting circuit 28 to produce a narrow DRIVE signal pulse after each CLOCK signal pulse with a delay $T_{TAD} = T_{TAD}(L)$. $T_{TAD}(L)$ may, for example, be 0. Since $T_{TAD} = T_{TAD}(L)$, driver 26 produces the DRIVE signal pulse with a delay of $T_{TAD}(L)+T_D$ after each CLOCK signal pulse. The TIMING and ACTION data sequence pattern generator 38 is to produce also tells timing and formatting circuit 28 to generate a COMPARE signal pulse after each CLOCK signal pulse with adjustable delay $T_{TAC}$ starting at 0 and increasing after each CLOCK signal pulse. Host computer 34 then signals pattern generator 38 of each channel to begin the test (step 106), waits until pattern generator 38 signals that the test is complete (step 108) and then reads the CH data from the data acquisition circuit 32 of each channel (step 110).

With driver 26 producing its output TEST signal pulse at time $T_{TAD}(L)+T_D$ relative to each clock signal pulse, the returning TEST signal pulse will arrive at the input of compare circuit 30 at time $T_{TAD}+T_D+2T_L$ after each CLOCK signal pulse. The compare circuit 30 samples its input signal at time $T_{TAC}+T_C$ after each CLOCK signal pulse. When $T_{TAC}+T_C$ is less than $T_{TAD}(L)+T_D+2T_L$, compare circuit 30 samples before the TEST signal arrives at its input. Thus its CH output bit is low. When $T_{TAC}+T_C$ reaches or exceeds $T_{TAD}(L)+T_D+2T_L$, as illustrated in FIG. 10, compare circuit 30 samples the TEST signal pulse and drives its CH output bit high.

Accordingly, host computer 34 examines the CH data acquired from the data acquisition circuit 32 of each channel to determine for each channel the test period in which CH first went high (step 112). That is the test period during which $T_{TAC}$ have a value $T_{TAC}(L)$ for which $$T_{TAC}(L)+T_C = T_{TAD}(L)+T_D+2T_L$$

Host computer 34 then determines the value of $T_{TAC}(L)$ from the TIMING data controlling $T_{TAC}$ for that test period (step 114) and computes the value of $T_L$(step 116) as follows:

$$T_L = (T_{TAC}(L) - T_{TAD}(L) + T_C - T_D)/2 \qquad [3A]$$

Since $T_{TAD}(L)$ was set to 0, then $$T_L = (T_{TAC}(L) + T_C - T_D)/2 \qquad [3B]$$

Setting Drive and Compare Calibration Delays

FIG. 12 illustrates a procedure host computer 34 carries out during a final phase of the calibration procedure in which it appropriately adjusts the calibration delays $CAL_D$ and $CAL_C$. With the values of $T_C$, $T_D$, and $T_L$ now determined, host computer 34 now computes (steps 120 and 122) suitable values of compare and drive calibration delays $T_{CC}$ and $T_{DC}$ for all channels as follows:

$$T_{DC} = T_{OFFSET} - T_D - T_L \qquad [4]$$

$$T_{CC} = T_{OFFSET} - T_C + T_L \qquad [5]$$

The $T_{OFFSET}$ variable can be any positive value provided it has the same value for all channels and provided that $T_{OFFSET}$ is larger than $T_D+T_L$ so as to avoid requiring $T_{DC}$ to be negative. Host computer 34 then adjusts the values of $CAL_C$ and $CAL_D$ accordingly (steps 124 and 126). Thereafter during tests of DUT 14, the timing of TEST signal produced by all channels TC(1)–TC(N) and the timing of RESPONSE signal sampling by all channels as indicated by the TIMING data supplied thereto will be referenced to the same absolute time $T_{OFFSET}$ following the edge of CLOCK pulse.

Single Transmission Line Per Channel Tester

Figure 13:
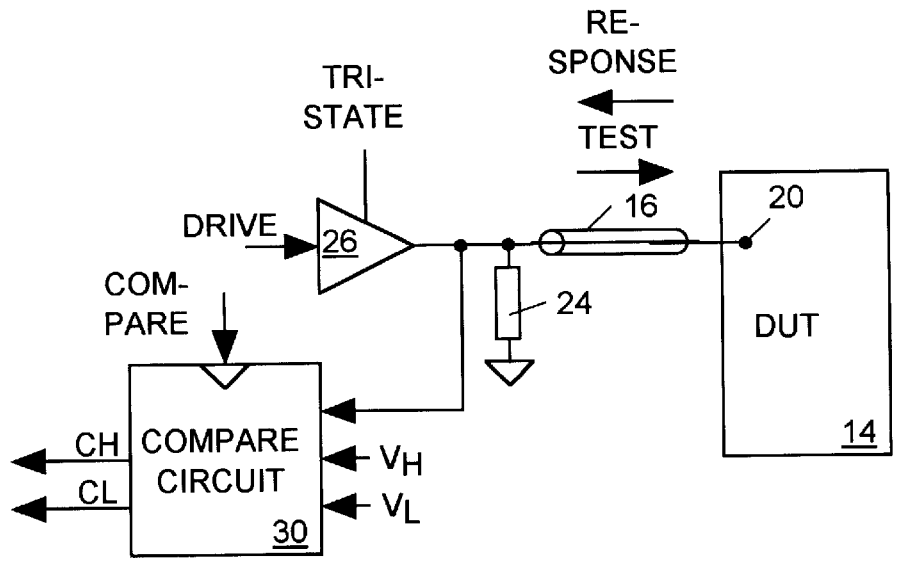
FIG. 13 illustrates in block diagram form a modification to a portion of the tester of FIG. 1 in which two transmission lines are used to access each DUT terminal.

As illustrated in FIG. 13, many integrated circuit testers employ only a single transmission line 16 per channel instead of two transmission lines 16A and 16B as used in tester 10 of FIG. 1. Line 16, terminated by impedance 24 delivers the TEST signal to terminal 20 of DUT 14 and also delivers the RESPONSE signal to COMPARE circuit 30. The calibration procedure described above also works for such single transmission line per channel testers. As discussed above, during the third phase of the calibration procedure, when the signal path delay $T_L$ of transmission line 16A and 16B is measured, a TEST signal pulse travels outward on line 16A and returns on line 16B and the round trip transit time is determined by finding an adjustable compare delay $T_{TAC}(L)$ for which compare circuit samples the returning TEST signal pulse. In the case of a single transmission line per channel tester, the TEST signal pulse travels outward to the remote end of transmission line 16. Since at that end the transmission line is open circuited (not connected to DUT 14 or to the salphasic plane, the TEST signal is reflected back over transmission line 16. In this case the round trip transit time is determined by finding an adjustable compare delay $T_{TAC}(L)$ for which compare circuit samples the leading edge of the reflected TEST signal pulse.

While the method described above for determining the inherent drive delay $T_D$(phase two of the calibration process) for the two transmission line per channel tester 10 of FIG. 1 will also work for the single transmission line per channel tester of FIG. 13, an alternative method for finding $T_D$ can be taken in the latter case. In the alternative method the calibration board 42 is removed.

Figure 14:
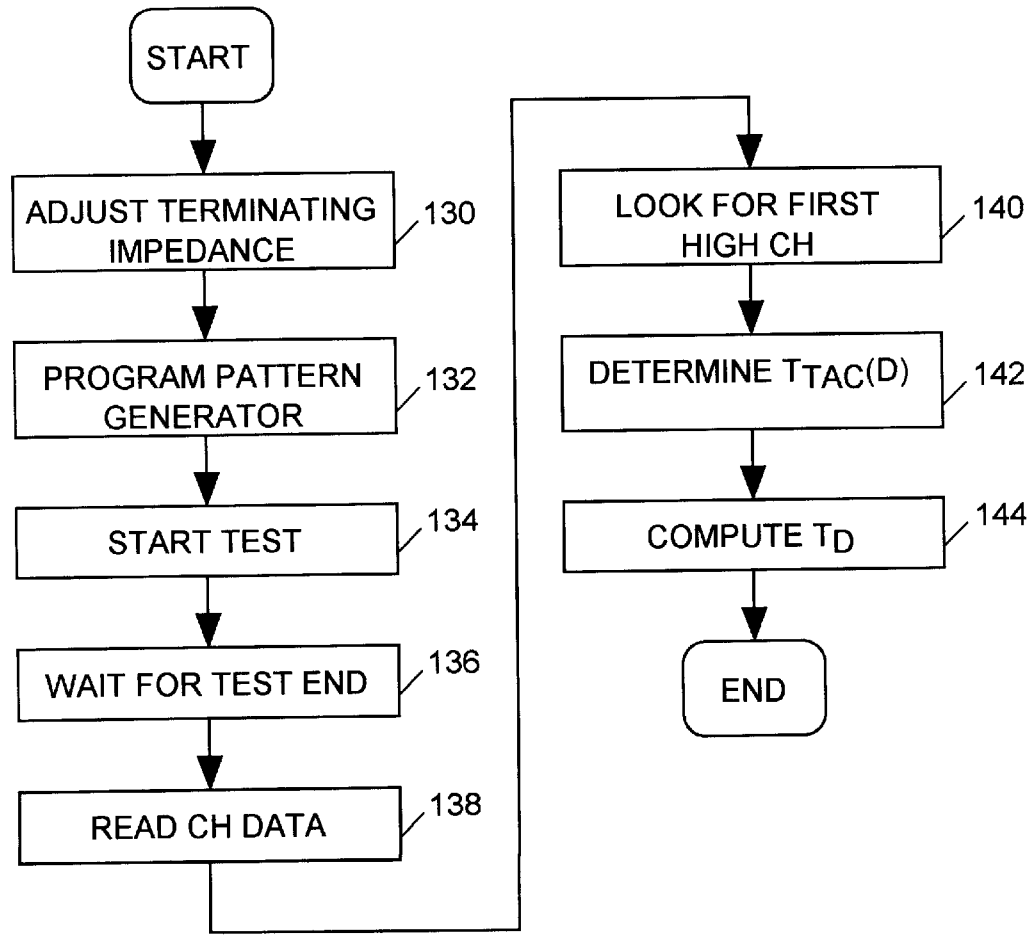
FIG. 14 illustrates a procedure carried out by the host computer of FIG. 1 when measuring inherent drive delay for the tester of FIG. 1 when modified as illustrated in FIG. 13.

FIG. 14 illustrates the sequence of operations the host computer performs in carrying out the alternative method for finding $T_D$. The host computer initially adjusts terminating impedance 24 of FIG. 13 to match the impedance of transmission line 16 so that it absorbs reflections (step 130). The host computer then programs pattern generator 38 (step 132) so that it produces a sequence of TIMING and ACTION data causing driver 26 to produce a DRIVE signal pulse after each CLOCK signal pulse with an adjustable delay $T_{TAD}=T_{TAD}(D)$ where $T_{TAD}(D)$ is any delay at least as large as $T_C$. The TIMING and ACTION data also causes timing and formatting circuit 28 to produce a COMPARE signal pulse with an adjustable delay $T_{TAC}$ that progressively increases from 0 after each CLOCK signal pulse so that compare circuit 30 samples the TEST signal output of driver 26 at progressively later times. The host computer then signals the pattern generators to start the test (step 134), waits for a signal from one of the pattern generators that the test has ended (step 136), reads the CH data out of the data acquisition circuit 32 of each channel (step 138), and determines for each channel the test period for which the CH bit first when high (step 140). It is during that period that compare circuit 30 sampled nearest the leading edge of the TEST signal. The host computer then determines the value $T_{TAC}(D)$ of $T_{TAC}$ for that period from the TIMING data (step 142). It then (step 144) calculates $T_D$ as follows:

$$T_D = T_{TAC}(D) - T_{TAD}(D) - T_C \qquad [6]$$

Timing and Formatting Circuit

Figure 15:
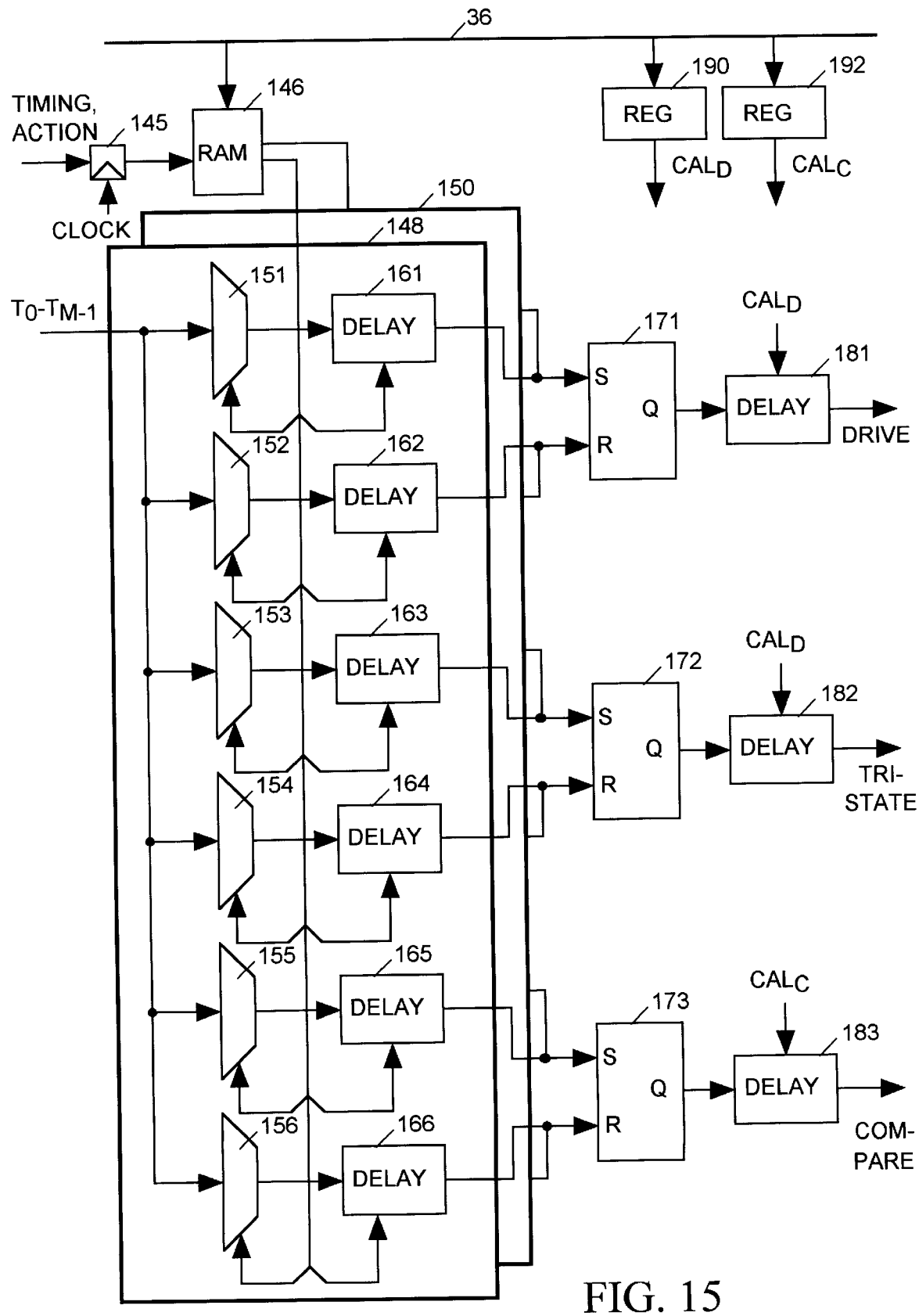
FIG. 15 illustrates timing and formatting circuit 28 of FIG. 1.

FIG. 15 illustrates timing and formatting circuit 28 of FIG. 1. The TIMING and ACTION data upon being clocked into a register 145 by the CLOCK signal address a RAM 146 contacting data provided by host computer 34 via bus 36. RAM 146 reads out control data to a set of two (or more) edge generators 148 and 150. Each edge generator includes a set of multiplexers 151–156 and a set of programmable delay circuits 161–166 controlled by data read out of RAM 146. Each multiplexer 151–156 selects one of the $T_0$–$T_{M-1}$ signals and passes it to a corresponding one of delay circuits 161–166. Each delay circuit 161 has a delay range of from 0 to $T_{SAL}/M$ where $T_{SAL}$ is the frequency of the CLOCK signal. Each delay circuit 161 delays its input signal by an amount indicated by its input control data and passes its output to either a set (S) input or a reset (R) input of one of a set of flip-flops 171–173. A set of three programmable delay circuits 181–183 respectively delay the Q outputs of flip-flops 171–173 to produce the DRIVE, TRISTATE and COMPARE signals, respectively. The $CAL_D$ data stored in a register 190 controls the delays of delay circuits 181 and 182 while the $CAL_C$ data stored in a register 192 controls the delay of delay circuit 183. The host computer writes the $CAL_C$ and $CAL_D$ data into registers 190 and 192 via bus 36.

Other Tester Architectures

While the foregoing specification has described preferred embodiment(s) of the present invention, one skilled in the art may make many modifications to the preferred embodiment without departing from the invention in its broader aspects. Many different types of pattern generators, timing and formatting circuits, data acquisition circuits and compare circuits have been used in integrated circuit testers. However all integrated circuit testers employ a master clock as a timing reference for producing output TEST signals and for sampling input RESPONSE signals. Also all integrated circuit testers have inherent drive and compare signal path delays and all integrated circuit testers connect to DUTs through transmission lines also having inherent signal path delays. Those skilled in the art will appreciate that the particular steps a host computer 34 must carry out during the calibration process to measure these inherent signal path delays must necessarily be adapted for the particular architecture and capabilities of tester. For example some testers do not have a data acquisition system 32 that can store CH and CL data but merely provide fail logic circuits which interrupt a host computer during any test cycle in which the CH or CL bit does not match expected states as indicated by the EXPECT data output of pattern generator. For such testers the host computer can use an iterative process for adjusting adjustable time delays when measuring inherent delays. For example during the first phase of the calibration procedure, when the adjustable delay of compare circuit 30 is progressively increased until it samples at the zero crossing of the SW signal, the host computer can iteratively program the pattern generator to produce a set of one cycle tests with the adjustable compare delay being altered for each test. The host computer determines the state of the $C_H$ bit by determining whether it was interrupted during the test cycle.

Thus while a preferred embodiment of the calibration system in accordance with the invention has been described and illustrated in connection with one particular tester architecture, those skilled in the art will appreciate that the calibration system can be easily adapted for use with other tester architectures. The appended claims therefore are intended to cover all such modifications as fall within the true scope and spirit of the invention.

What is claimed is:

1. For an integrated circuit tester producing output TEST signals, each following a pulse of a reference CLOCK signal with a delay that is a sum of an inherent drive delay $T_D$ and an adjustable drive delay $T_{TAD}$, and for sampling input RESPONSE signals following a pulse of the reference CLOCK signal with a delay that is a sum of an inherent compare delay $T_C$ and an adjustable compare delay $T_{TAC}$, the tester including transmission lines having remote ends for contacting terminals of an integrated circuit device of the transmission lines conveying said TEST signals from the tester to said terminals and conveying said RESPONSE signals from said terminals to said tester, the transmission lines having inherent line delays $T_L$, a method for measuring at least one of the inherent drive, compare and line delays comprising the steps of:

(a) generating a standing wave signal crossing a reference voltage level concurrently at every point within a region of a conductive plane with a fixed delay $T_{REF}$ after each pulse of the CLOCK signal, and (b) contacting said region with said remote ends of said transmission lines so that said transmission lines convey said standing wave signal to the tester.

2. The method in accordance with claim 1 further comprising the step of:

(c) adjusting said adjustable compare delay $T_{TAC}$ to a value $T_{TAC}(ZERO)$ for which said tester samples said standing wave signal substantially at times said standing wave signal crosses said reference voltage level.

3. The method in accordance with claim 2 further comprising the step of:

(d) computing said inherent compare delay $T_C$ as a function of $T_{REF}$ and $T_{TAC}(ZERO)$.

4. The method in accordance with claim 3 further comprising the step of:

(e) causing said tester to generate two TEST signal pulses timed so that they do not substantially distort a zero crossing of said standing wave signal with an edge of one of said two TEST signal pulses being determined by a value $T_{TAD}(ZERO)$ of said adjustable drive delay $T_{TAD}$.

5. The method in accordance with claim 4 further comprising the step of:

(f) computing said inherent drive delay $T_D$ as a function of $T_{TAD}(ZERO)$, $T_{TAC}(ZERO)$ and the inherent compare delay $T_C$ computed at step (d).

6. The method in accordance with claim 5 further comprising the steps of:
   (g) removing said remote ends of said transmission lines from contact with said region;
   (h) adjusting said adjustable drive delay $T_{TAD}$ to a fixed value $T_{TAD}(L)$ such that said tester generates said TEST signals on said transmission lines with a delay $T_{TAD}(L)$ after each CLOCK signal pulse wherein each said TEST signal travels to a remote end of one of said transmission lines and then returns to said tester via one of said transmission lines.

7. The method in accordance with claim 6 further comprising the step of:
   (i) adjusting said adjustable compare delay for each transmitted TEST signal so that said tester samples substantially at the leading edge of the TEST signal as it returns to said tester.

8. The method in accordance with claim 7 further comprising the step of:
   (j) computing the line delay $T_L$ of each transmission line as a function of $T_{TAC}(L)$, $T_{TAD}(L)$, the inherent compare delay $T_C$ computed at step (d) and the inherent drive delay $T_D$ computed at step (f).

9. The method in accordance with claim 3 further comprising the steps of:
   (e) removing said remote ends of said transmission lines from contact with said region;
   (f) adjusting the adjustable drive delay to a value $T_{TAD}(D)$ where $T_{TAD}(D)$ is any delay at least as large as the inherent compare delay $T_C$ computed at step (d) so that said tester produces each TEST signal after each CLOCK signal pulse with a delay of $T_{TAD}(D)+T_D$, and
   (g) adjusting the adjustable compare delay $T_{TAC}$ to a value $T_{TAC}(D)$ for which the tester samples leading edges of the TEST signals.

10. The method in accordance with claim 9 further comprising the step of:
    (h) computing said inherent drive delay $T_D$ as a function of $T_{TAD}(D)$, $T_{TAC}(D)$ and the inherent compare delay $T_C$ computed at step (d).

11. The method in accordance with claim 10 further comprising the steps of:
    (i) adjusting said adjustable drive delay $T_{TAD}$ to a fixed value $T_{TAD}(L)$ such that said tester generates said TEST signals on said transmission lines with a delay $T_{TAD}(L)$ after each CLOCK signal pulse wherein each said TEST signal travels to a remote end of one of said transmission line and then returns to said tester via said one transmission line.

12. The method in accordance with claim 11 further comprising the step of:
    (j) adjusting said adjustable compare delay for each transmitted TEST signal so that said tester samples substantially at the leading edge of the TEST signal as it returns to said tester.

13. The method in accordance with claim 12 further comprising the step of:
    (k) computing the line delay $T_L$ of each transmission line as a function of $T_{TAC}(L)$, $T_{TAD}(L)$, the inherent compare delay $T_C$ computed at step (d) and the inherent drive delay $T_D$ computed at step (h).

14. For an integrated circuit tester generating output TEST signals, each following a pulse of a reference CLOCK signal with a drive delay that is a sum of an inherent drive delay $T_D$ and an adjustable drive delay $T_{TAD}$, and for sampling input RESPONSE signals following a pulse of the reference CLOCK signal with a compare delay that is a sum of an inherent compare delay $T_C$ and an adjustable compare delay $T_{TAC}$, the tester including transmission lines including remote ends for contacting terminals of an integrated circuit device for conveying said TEST signals from the tester to said terminals and for conveying said RESPONSE signals from said terminals to said tester, the transmission lines having inherent line delays $T_L$, a method for calibrating TEST signal generation timing and RESPONSE signal sampling timing of said integrated circuit tester comprising the steps of:

(a) generating a standing wave signal crossing a reference voltage level concurrently at every point within a region of a conductive plane with a fixed delay $T_{REF}$ after each pulse of the CLOCK signal;

(b) contacting said region with said remote ends of said transmission lines so that said transmission lines convey said standing wave signal to the tester;

(c) adjusting said adjustable compare delay to a value $T_{TAC}(ZERO)$ for which said tester samples said standing wave signal substantially at times said standing wave signal crosses said reference voltage level;

(d) computing said inherent compare delay $T_C$ as a function of $T_{REF}$ and $T_{TAC}(ZERO)$;

(e) causing said tester to generate two TEST signal pulses timed so that they do not substantially distort a zero crossing of said standing wave signal with an edge of one of said two TEST signal pulses being determined by a value $T_{TAD}(ZERO)$ of said adjustable drive delay $T_{TAD}$;

(f) computing said inherent drive delay $T_D$ as a function of $T_{TAD}(ZERO)$, $T_{TAC}(ZERO)$ and the inherent compare delay $T_C$ computed at step (d);

(g) removing said remote ends of said transmission lines from contact with said region;

(h) adjusting said adjustable drive delay $T_{TAD}$ to a fixed value $T_{TAD}(L)$ such that said tester generates said TEST signals on said transmission lines with a delay $T_{TAD}(L)$ after each CLOCK signal pulse wherein each said TEST signal travels to a remote end of one of said transmission lines and then returns to said tester via one of said transmission lines;

(i) adjusting said adjustable compare delay for each transmitted TEST signal so that said tester samples substantially at the leading edge of the TEST signal as it returns to said tester;

(j) computing the line delay $T_L$ of each transmission line as a function of $T_{TAC}(L)$, $T_{TAD}(L)$, the inherent compare delay $T_C$ computed at step (d) and the inherent drive delay $T_D$ computed at step (f); and (k) adding a drive calibration delay $T_{DC}$ to said drive delay and a compare calibration delay $T_{CC}$ to said compare delay such that $$T_{DC}=T_{OFFSET}-T_D-T_L$$

and $$T_{CC}=T_{OFFSET}-T_C+T_L,$$

wherein $T_{OFFSET}$ is any delay at least as large as $T_D+T_L$.

15. For an integrated circuit tester generating output TEST signals, each following a pulse of a reference CLOCK signal with a drive delay that is a sum of an inherent drive delay $T_D$ and an adjustable drive delay $T_{TAD}$, and for sampling input RESPONSE signals following a pulse of the reference CLOCK signal with a compare delay that is a sum of an inherent compare delay $T_C$ and an adjustable compare delay $T_{TAC}$, the tester including transmission lines including remote ends for contacting terminals of an integrated circuit device for conveying said TEST signals from the tester to said terminals and for conveying said RESPONSE signals from said terminals to said tester, the transmission lines having inherent line delays $T_L$, a method for calibrating TEST signal generation timing and RESPONSE signal sampling timing of said integrated circuit tester comprising the steps of:

(a) generating a standing wave signal crossing a reference voltage level concurrently at every point within a region of a conductive plane with a fixed delay $T_{REF}$ after each pulse of the CLOCK signal;

(b) contacting said region with said remote ends of said transmission lines so that said transmission lines convey said standing wave signal to the tester;

(c) adjusting said adjustable compare delay to a value $T_{TAC}(ZERO)$ for which said tester samples said standing wave signal substantially at times said standing wave signal crosses said reference voltage level;

(d) computing said inherent compare delay $T_C$ as a function of $T_{REF}$ and $T_{TAC}(ZERO)$ (e) removing said remote ends of said transmission lines from contact with said region;

(f) adjusting the adjustable drive delay to a value $T_{TAD}(D)$ where $T_{TAD}(D)$ is any delay at least as large as the inherent compare delay $T_C$ computed at step (d) so that said tester produces each TEST signal after each CLOCK signal pulse with a delay of $T_{TAD}(D)+T_D$; and (g) adjusting the adjustable compare delay $T_{TAC}$ to a value $T_{TAC}(D)$ for which the tester samples leading edges of the TEST signals;

(h) computing said inherent drive delay $T_D$ as a function of $T_{TAD}(D)$, $T_{TAC}(D)$ and the inherent compare delay $T_C$ computed at step (d);

(i) adjusting said adjustable drive delay $T_{TAD}$ to a fixed value $T_{TAD}(L)$ such that said tester generates said TEST signals on said transmission lines with a delay $T_{TAD}(L)$ after each CLOCK signal pulse wherein each said TEST signal travels to a remote end of one of said transmission line and then returns to said tester via said one transmission line;

(j) adjusting said adjustable compare delay for each transmitted TEST signal so that said tester samples substantially at the leading edge of the TEST signal as it returns to said tester;

(k) computing the line delay $T_L$ of each transmission line as a function of $T_{TAC}(L)$, $T_{TAD}(L)$, the inherent compare delay $T_C$ computed at step (d) and the inherent drive delay $T_D$ computed at step (h); and (l) adding a drive calibration delay $T_{DC}$ to said drive delay and a compare calibration delay $T_{CC}$ to said compare delay such that $$T_{DC}=T_{OFFSET}-T_D-T_L$$

and $$T_{CC}=T_{OFFSET}-T_C+T_L,$$

wherein $T_{OFFSET}$ is any delay at least as large as $T_D+T_L$.

16. A timing calibration apparatus for an integrated circuit tester of the type which tests an integrated circuit device under test (DUT) by transmitting a TEST signals to terminals of said DUT and sampling RESPONSE signals produced by said DUT at said terminals, said TEST signals being delivered from said tester to said terminals and said RESPONSE signals being delivered from said terminals to said tester via a plurality of transmission lines contacting said terminals, wherein said integrated circuit tester times TEST signal transmission and RESPONSE signal sampling in reference to a periodic CLOCK signal, the timing calibration apparatus comprising:

a conductive plane contacting said transmission lines, and means for generating a standing wave signal on said conductive plane wherein said standing wave signal is phase locked to said CLOCK signal.

17. The timing calibration apparatus in accordance with claim 16 wherein said transmission lines convey said standing wave signal to said tester.

18. The timing calibration apparatus in accordance with claim 17 wherein each of said transmission lines contacts a separate point within a homophasic region of said conductive plane.

* * * * *